(12) United States Patent
Gao

(10) Patent No.: US 10,345,697 B2
(45) Date of Patent: Jul. 9, 2019

(54) MASK PLATES AND MANUFACTURING METHODS OF ARRAY SUBSTRATES

(71) Applicant: Shenzhen China Star Optoelectronics Technology Co., Ltd., Shenzhen, Guangdong (CN)

(72) Inventor: Dongzi Gao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 79 days.

(21) Appl. No.: 15/541,681

(22) PCT Filed: Jun. 16, 2017

(86) PCT No.: PCT/CN2017/088614
§ 371 (c)(1),
(2) Date: Jul. 5, 2017

(87) PCT Pub. No.: WO2018/205345
PCT Pub. Date: Nov. 15, 2018

(65) Prior Publication Data
US 2018/0329287 A1    Nov. 15, 2018

(30) Foreign Application Priority Data
May 10, 2017  (CN) .......................... 2017 1 0325080

(51) Int. Cl.
*G03F 1/58* (2012.01)
*H01L 27/12* (2006.01)
(Continued)

(52) U.S. Cl.
CPC .............. *G03F 1/58* (2013.01); *G02F 1/1303* (2013.01); *G03F 1/50* (2013.01); *H01L 21/0274* (2013.01);
(Continued)

(58) Field of Classification Search
None
See application file for complete search history.

(56) References Cited

U.S. PATENT DOCUMENTS 9,312,146 B2 * 4/2016 Kong ................ H01L 29/42384
2010/0047974 A1 * 2/2010 Lim .................... H01L 27/1288
438/158
(Continued)

FOREIGN PATENT DOCUMENTS

| CN | 101546733 A | 9/2009 |
| CN | 101615594 A | 12/2009 |
| CN | 101738846 A | 6/2010 |

*Primary Examiner* — Angel Roman
(74) *Attorney, Agent, or Firm* — Andrew C. Cheng

(57) ABSTRACT

The present disclosure relates to a mask plate and a manufacturing method of array substrates. The mask plate includes: at least two first sub-areas and at least one second sub-area. Wherein the first sub-areas are spaced apart from each other, and the first sub-areas are configured to be as semi-transparent areas, and a transmittance rate of the the second sub-area is greater than the first sub-area. When conducting an exposure process on a photoresist, a thickness of the exposed photoresist via the second sub-area is greater than a thickness of the exposed photoresist via the first sub-area. When manufacturing an array substrate, a channel of the array substrate corresponds to the second sub-area. The time for conducting the exposure process and an ashing process may be reduced by adopting the mask plate when manufacturing the array substrates.

12 Claims, 4 Drawing Sheets

(51) Int. Cl.

| | | |
|---|---|---|
| *H01L 29/66* | (2006.01) | |
| *H01L 21/027* | (2006.01) | |
| *H01L 21/3213* | (2006.01) | |
| *H01L 21/308* | (2006.01) | |
| *G02F 1/13* | (2006.01) | |
| *G03F 1/50* | (2012.01) | |
| *G03F 7/26* | (2006.01) | |
| *G03F 7/16* | (2006.01) | |
| *G03F 7/20* | (2006.01) | |

(52) U.S. Cl.
CPC .... *H01L 21/3086* (2013.01); *H01L 21/32139* (2013.01); *H01L 27/1288* (2013.01); *H01L 29/66765* (2013.01); *G03F 7/16* (2013.01); *G03F 7/20* (2013.01); *G03F 7/26* (2013.01)

(56) References Cited

U.S. PATENT DOCUMENTS

2012/0313093 A1* 12/2012 Kim .................. H01L 27/1225
 257/43
2017/0084644 A1* 3/2017 Kang ................. H01L 27/1288

\* cited by examiner

MASK PLATES AND MANUFACTURING METHODS OF ARRAY SUBSTRATES

BACKGROUND

1. Technical Field

The present disclosure relates to display field, and particularly to a mask plate and a manufacturing method of array substrates.

2. Description of Related Art

With respect to the flat panel display field, the thin film transistor (TFT) is the key element for manufacturing the display devices, and the mask plate is an indispensable tool during the manufacturing process of the TFTs.

Referring to FIG. 1, the semi-transparent film 2 is configured between two shading areas 1 in the conventional mask plate. When conducting the exposure process, the two shading areas 1 are completely opaque, and thus the photoresist 3 with respect to the two shading areas 1 may be reserved. And only the part of the light may pass through the semi-transparent film 2, thus the photoresist 3 with respect to the semi-transparent film 2 may be partially exposed. In the subsequent process, the remaining photoresist with respect to the semi-transparent film 2 is completely ashed. And a channel of the TFT is obtained corresponding to the semi-transparent film 2 after a series of processes.

The manufacturing process of the TFT adopting the conventional mask plate may require longer time for conducting the exposure process and the ashing process, which may result in lower productivity and greater power-consuming.

SUMMARY

The present disclosure relate to a mask plate and a manufacturing method of array substrates configured to reduce the time for conducting the exposure process and the ashing process, so as to reduce power-consuming.

In one aspect, the present disclosure relate to the mask plate including: a first area configured with at least two first sub-areas, wherein the first sub-areas are spaced apart from each other, and the first sub-areas are configured to be semi-transparent areas; a second area configured with at least one second sub-area, wherein the second sub-area is configured between the first sub-areas, and a transmittance rate of the second sub-area is greater than the first sub-area; a third area and a fourth area respectively configured next to two sides of the first area; a fifth area and a sixth area respectively configured next to one side of the third area and one side of the fourth area, wherein the side of the third area and the side of the fourth area are facing away the first area; wherein the second sub-area is configured to be a hollow area or to be a non-hollow area having the transmittance rate greater than the first sub-area; when the second sub-area is configured to be the hollow area, a width of the second sub-area is less than a resolution of an exposure machine, the third area and the fourth area are configured to be shading areas, and the fifth area and the sixth area are configured to be full translucent areas; when conducting an exposure process on a photoresist, a thickness of the exposed photoresist via the second sub-area is greater than a thickness of the exposed photoresist via the first sub-area; when manufacturing an array substrate, a channel of the array substrate corresponds to the second sub-area.

In another aspect, the present disclosure relates to the mask plate, including: a first area configured with at least two first sub-areas, wherein the first sub-areas are spaced apart from each other, and the first sub-areas are configured to be semi-transparent areas; a second area configured with at least one second sub-area, wherein the second sub-area is configured between the first sub-areas, and a transmittance rate of the second sub-area is greater than the first sub-area; wherein a thickness of the exposed photoresist via the second sub-area is greater than a thickness of the exposed photoresist via the first sub-area when conducting an exposure process on a photoresist; when manufacturing an array substrate, at least one channel of the array substrate corresponds to the at least one second sub-area.

In another aspect, the present disclosure relates to an array substrate, including: providing a substrate; forming a gate layer, an insulation layer covering the gate layer and the substrate, a semiconductor layer covering the insulation layer, a second metal layer covering the semiconductor layer, and a photoresist layer covering the second metal layer on the substrate in sequence; providing a mask plate and conducting an exposure process on the photoresist layer via the mask plate; conducting a development process and transferring patterns on the mask plate onto the photoresist layer; wherein the mask layer includes: a first area is configured with at least two first sub-areas, wherein the first sub-areas are spaced apart from each other, and the first sub-areas are configured to be semi-transparent areas; a second area is configured with at least one second sub-area, wherein the second sub-area is configured between the first sub-areas, and a transmittance rate of the second sub-area is greater than the first sub-area; when conducting an exposure process on a photoresist, a thickness of the exposed photoresist via the second sub-area is greater than a thickness of the exposed photoresist via the first sub-area, and the photoresist layer with respect to the first sub-area and the second sub-area is partially exposed.

In view of the above, the first area in the mask plate of the present disclosure is configured to be the semi-transparent area and is configured with the at least two first sub-area spaced apart from each other. When manufacturing the array substrate, due to the transmittance rate of the second sub-area is greater than the first sub-area, the thickness of the exposed photoresist on the second sub-area is greater than the thickness of the exposed photoresist on the first sub-area. The photoresist corresponding to the second sub-area may be exposed deeper under the same exposure amount when being compared with the conventional exposure process. As such, the present disclosure may reduce the time and the power for the exposure process. In the subsequent ashing process, the present disclosure may terminate the ashing process upon the photoresist corresponding to the second sub-area is completely ashed, and the thickness of the exposed photoresist corresponding to the second sub-area is less than the exposed photoresist corresponding to the first sub-area. After conducting the development process, the thickness of the remaining photoresist corresponding to the second sub-area is less than the thickness of the remaining photoresist corresponding to the first sub-area. As such, the time and the power for conducting the ashing process may be reduced, and the productivity may be improved.

DETAILED DESCRIPTION

Figure 1:
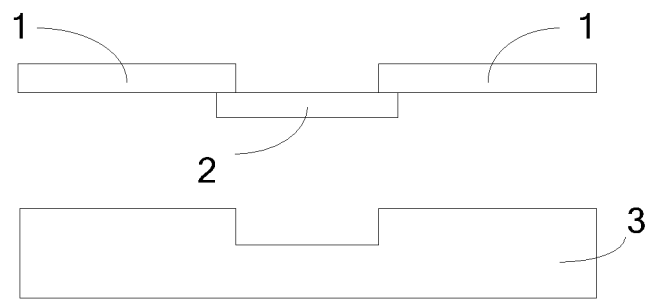
FIG. 1 is a schematic view of a conventional mask plate when conducting an exposure process.
Figure 2:
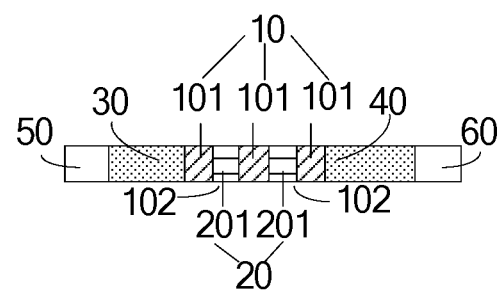
FIG. 2 is a schematic view of a mask plate in one embodiment of the present disclosure.

Referring to FIG. 2, the present disclosure relates to a mask plate, including: a first area 10, a second area 20, a third area 30, a fourth area 40, a fifth area 50, and a sixth area 60.

The first area 10 is configured with at least two first sub-areas 101, wherein the first sub-areas 101 are spaced apart from each other, and at least one gap 102 are configured between the first sub-areas 101. In one example, as shown in FIG. 2, the first area 10 may include three first sub-areas 101, but is not limited. In another example, the first area may include two, three, or even more first sub-areas.

The first sub-areas 101 are configured to be semi-transparent areas, and thus only a portion of the light beams may pass through the the first sub-areas 101, the remaining portions of the light beams may be reflected. Specifically, the first sub-areas 101 may be made of semi-transparent film.

The second area 20 is configured with at least one second sub-area 201, wherein the second sub-area 201 is configured in the gap 102 between the first sub-areas 101. In one example, as shown in FIG. 2, the first area 10 may include three first sub-areas 101, and the second area 20 may include two second sub-areas 201.

A transmittance rate of the second sub-area 201 is greater than the first sub-areas 101. As such, when conducting an exposure process on a photoresist via the mask plate during the manufacturing process of the substrate, a thickness of the exposed photoresist via the second sub-area 201 is greater than a thickness of the exposed photoresist via the first sub-areas 101. A thickness of the remaining photoresist of the second sub-area 201 is less than a thickness of the remaining photoresist of the first sub-areas 101 after a development process. An ashing process is conducted on the remaining photoresist, and the ashing process may be terminated upon the photoresist corresponding to the second sub-area is completely ashed. And at least one channel may be formed on the array substrate corresponding to the at least one second sub-area 201 after conducting an etching process.

Conventionally, the photoresist corresponding to a whole semi-transparent film 2 is exposed to the same degree. However, the present disclosure may only expose the at least one second sub-area to a required thickness. Due to the transmittance rate of the at least one second sub-area 201 is greater than the at least two first sub-area 101, the exposure time and the power may be reduced in the present disclosure when being compared with the conventional manufacturing method. The ashing process may only be conducted on the remaining photoresist corresponding to the second sub-area 201 in the present disclosure, such that the time and time power for the ashing process may be reduced, so as to improve to productivity.

In one example, the second sub-area 201 is configured to be a hollow area or to be a non-hollow area having the transmittance rate greater than the first sub-area 101. The second sub-area 201 is configured to be the hollow area that indicates the first area 10 used to be a complete semi-transparent area, such as a complete transparent film, and at least one sub-area of the first area 10 is hollowed out to form the at least two first sub-area 101 spaced apart from each other. The hollowed portion of the first sub-area 101 is configured to be the at least one second sub-area 201. A width of the second sub-area 201 is less than a resolution of a exposure machine, for example less than 2.5 mm, of an exposure machine so as to guarantee the channel may be formed on the array substrate corresponding to the second sub-area, so that a diffraction effect may occur and the subsequent process may be completed.

In one example, in order to obtain a thinner channel of the array substrate, the exposed photoresist via the second sub-area 201 corresponds to the second sub-area 201 when conducting the exposure process on the photoresist. As such, the channel of the array substrate may correspond to the second sub-area 201 after a series manufacturing process, wherein the width of the channel is configured to be the width of the photoresist. Conventionally, the width of the channel is configured to be a width of a gap between two shading areas 1. The present disclosure adopts the mask plate to reduce the width of the channel and to improve charging rate. Specifically, the second area 20 may include one or two second sub-areas 201. When the second area 20 includes two second sub-areas 201, a double seam interference effect may be occur, such that a bright strip may be formed within an area corresponding to the photoresist after the light beams pass through the two second sub-areas 201. The exposure process may be conducted via the bright stripe. As such, the exposure position of the two second sub-areas 201 may be the same. The channel may be formed after the series manufacturing process.

In one example, the mask plate may include the third area 30, the fourth area 40, the fifth area 50, and the sixth area 60.

Figure 3:
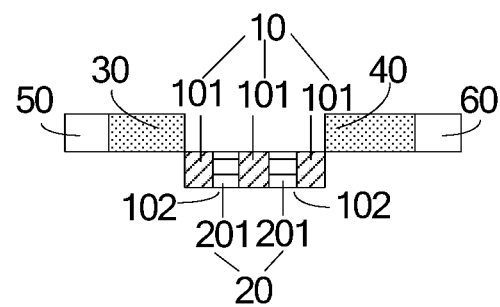
FIG. 3 is a schematic view of a mask plate in one embodiment of the present disclosure.

The third area 30 and the fourth area 40 are respectively configured next to two sides of the first area 10. The third area 30 and the fourth area 40 may be in the same plane with the first area 10, as shown in FIG. 2, and may not be in the same plane with the first area 10, as shown in FIG. 3. Wherein the third area 30 and the fourth area 40 are configured to be the shading areas 40. In one example, as shown in FIG. 3, the first area 10 may be configured below the third area 30 and the fourth area 40. In another example, the first area 10 may be configured on the third area 30 and the fourth area 40.

The fifth area 50 and the sixth area 60 are respectively configured next to one side of the third area 30 and one side of the fourth area 40, wherein the side of the third area 30 and the side of the fourth area 40 are facing away the first area 10, and the fifth area 50 and the sixth area 60 are configured to be full translucent areas.

Figure 4:
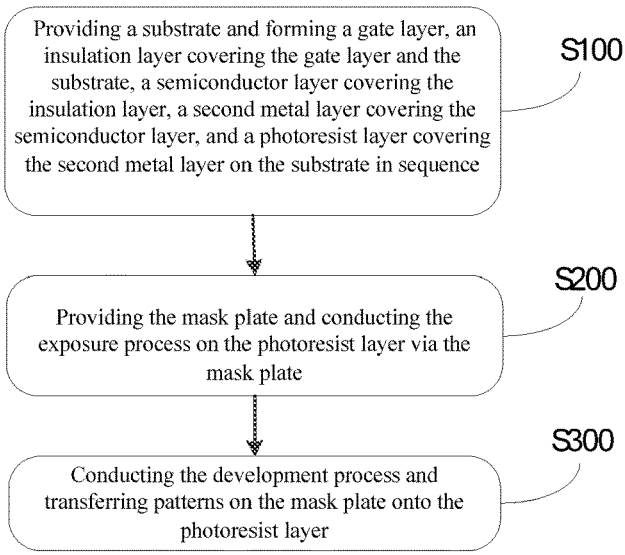
FIG. 4 is a flowchart of a manufacturing method of array substrates in one embodiment of the present disclosure.

Referring to FIG. 4, the present disclosure further relates to a manufacturing process of the array substrates, including the following steps.

In S100: providing a substrate and forming a gate layer, an insulation layer covering the gate layer and the substrate, a semiconductor layer covering the insulation layer, a second metal layer covering the semiconductor layer, and a photoresist layer covering the second metal layer on the substrate in sequence.

Figure 5:
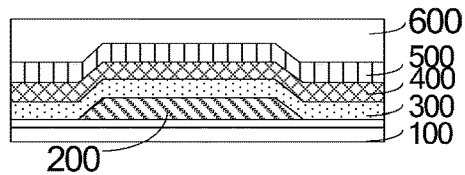
FIG. 5 is a schematic view illustrating an array substrate in step S100 shown in FIG. 4 in one embodiment of the present disclosure.

Referring to FIG. 5, the substrate 100 is provided. The substrate 100 is made of a material having good optical performance, high transparency, and low reflectivity. In one example, the the substrate 100 may be made of glass.

The gate layer 200, the insulation layer 300 covering the gate layer 200 and the substrate 100, the semiconductor layer 400 covering the insulation layer 300, the second metal layer 500 covering the semiconductor layer 400, and the photoresist layer 600 covering the second metal layer 500 are formed on the substrate 100 in sequence.

Specifically, the step of forming the gate layer 200 further includes: forming a first metal layer (not shown) on the substrate 100, and conducting a patterned process on the first metal layer to form the gate layer 200.

The gate layer 200 and the second metal layer 500 are made of one or more combination of molybdenum, titanium, aluminum and copper. The insulation layer 300 is made of one or more combination of silicon oxide and silicon nitride. The semiconductor layer 400 is made of amorphous silicon or polysilicon.

In S200: providing the mask plate and conducting the exposure process on the photoresist layer via the mask plate.

Figure 6:
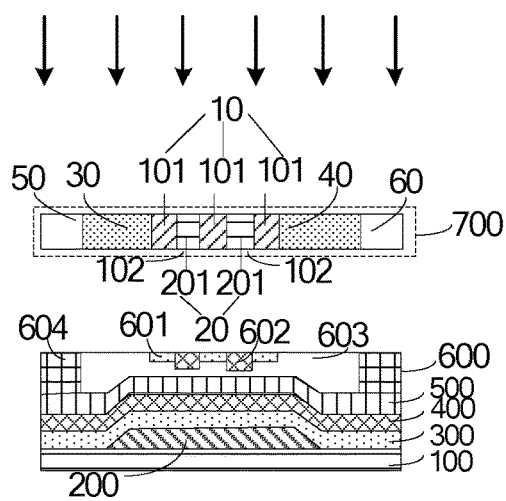
FIG. 6 is a schematic view illustrating an array substrate in step S200 shown in FIG. 4 in one embodiment of the present disclosure.

Referring to FIG. 6, the mask plate 700 is provided, and the exposure process is conducted on the photoresist layer 600 via the mask plate 700, wherein the mask plate 700 may be configured to be one of the mask plates described above, and may not be described again.

The exposure process is to transfer patters of the mask plate 700 onto the photoresist 600 by exposing the ultraviolet (UV). A s shown in FIG. 6, after conducting the exposure process, the photoresist layer 600 may be divided into a first exposure area 601 and a second exposure area 602, wherein the the first exposure area 601 corresponds to the at least two first sub-areas 101 of the mask plate 700, and the second exposure area 602 corresponds to the at least one second sub-area 201.

The transmittance rate of the second sub-area 201 is greater than the first sub-area 101, and thus when conducting the exposure process on the photoresist, a thickness of the exposed second exposure area 602 is greater than a thickness of the exposed first exposure area. Due to the first sub-area 101 is configured to be the semi-transparent area, the transmittance rate of a non-hollowed area of the second sub-area 201 is greater than the first sub-area 101, and the width of the hollowed area of the second sub-area 201 is less than the resolution of the exposure machine, the photoresist of the photoresist layer 600 corresponding to the first sub-area 101 and the second sub-area 102 is partially exposed when conducting the exposure process.

In view of the above, the present disclosure may only expose the photoresist corresponding to the at least two second sub-area 201 to the required thickness, and the photoresist corresponding to the second sub-area 201 may be exposed deeper under the same exposure amount when being compared with the conventional exposure process. As such, the present disclosure may reduce the time and the power for the exposure process and may improve the productivity.

In one example, the mask plate 700 may include the third area 30, the fourth area 40, the fifth area 50, and the sixth area 60. After conducting the exposure process, the photoresist layer may further include a third exposure area 603 and a fourth exposure area 604. Wherein the third exposure area 603 corresponds to the third area 30 and fourth area 40 of the mask plate 700 and the fourth area 604 corresponds to the fifth area 50 and the sixth area 60 of the mask plate 700. The third area 30 and the fourth area 40 are configured to be the shading areas, and thus the photoresist corresponding to the third exposure area 603 is partially exposed. The fifth area 50 and the sixth area 60 are configured to be the full-transparent areas, and thus the photoresist layer 600 corresponding to the fourth exposure area 604 is completely exposed.

Figure 7:
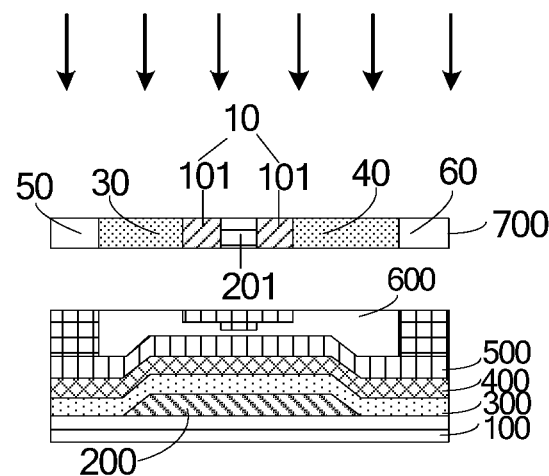
FIG. 7 is a schematic view illustrating the array substrate in step S200 shown in FIG. 4 in another embodiment of the present disclosure.

In order to obtain the thinner channel, the exposed photoresist layer 600 via the second sub-area 201 of the mask plate 700 corresponds to the second sub-area 201 when conducting the exposure process on the photoresist layer 600 via the mask plate 700. In one example, as shown in FIG. 7, the second area 20 may include one or two second sub-area 201. When the second area 20 includes two second sub-areas 201, the double seam interference effect may be conducted, such that the bright strip may be formed within the area corresponding to the photoresist. The exposure process may be conducted on the photoresist layer via the bright stripe.

In S300: conducting the development process and transferring patterns on the mask plate onto the photoresist layer.

Figure 8:
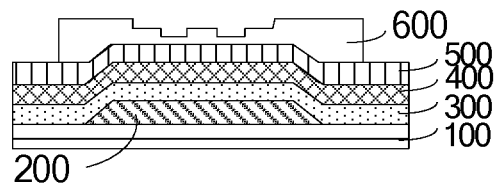
FIG. 8 is a schematic view illustrating an array substrate in step S300 shown in FIG. 4 in one embodiment of the present disclosure.

As shown in FIG. 8, the development process is conducted via developer. Specifically, the exposed photoresist may be dissolved, and the patterns of the mask plate 700 may be transferred onto the photoresist layer 600.

In one example, after the step S300, the manufacturing method may further include the following steps.

In S400: conducting the patterned process on the second metal layer and the semiconductor layer via the remaining photoresist of the photoresist layer.

Figure 9:
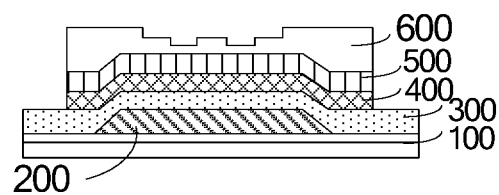
FIG. 9 is a schematic view illustrating an array substrate in step S400 in one embodiment of the present disclosure.

As shown in FIG. 9, a first etching process is conducted to remove a first portion of the second metal layer 500 and the semiconductor layer 400, wherein the portion of the second metal layer 500 and the semiconductor layer 400 are not covered by the photoresist layer 600.

In one example, after the step S400, the manufacturing method may further include the following steps.

In S500: conducting the ashing process on the remaining photoresist of the photoresist layer and terminating the ashing process upon the photoresist layer corresponding to the second sub-area is completely ashed.

Figure 10:
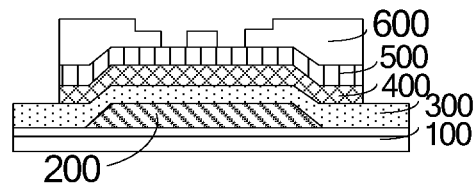
FIG. 10 is a schematic view illustrating an array substrate in step S500 in one embodiment of the present disclosure.

As shown in FIG. 10, the ashing process is conducted on the remaining photoresist layer 600, and the ashing process may be terminated upon the photoresist of the photoresist layer corresponding to the second sub-area is completely ashed.

The thickness of the remaining photoresist corresponding to the second sub-area 201 is less than the thickness of the remaining photoresist corresponding to the first sub-area 101. Conventionally, the ashing process is conducted on the whole of the remaining photoresist on the semi-transparent film 2. Therefore the present disclosure may reduce time and power for conducting the ashing process and may improve productivity when being compared with the conventional manufacturing method.

In one example, after the step S500, the manufacturing method may further include the following steps.

In S600: conducting the patterned process on the second metal layer and the semiconductor layer via the remaining photoresist layer, wherein the at least one channel is formed on the array substrate corresponding to the at least one second sub-area.

Figure 11:
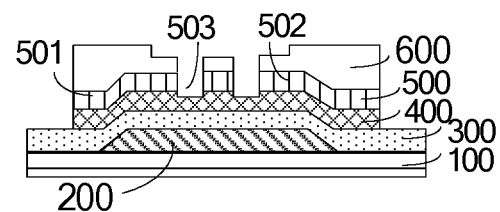
FIG. 11 is a schematic view illustrating an array substrate in step S600 in one embodiment of the present disclosure.

As shown in FIG. 11, a second etching process is conducted to remove a second portion of the second metal layer 500 and the semiconductor layer 400, so as to form a source 501 and a drain 502, wherein the second portion of the second metal layer 500 and the semiconductor layer 400 are not covered by the photoresist layer 600. The at least one channel 503 is formed on the array substrate corresponding to the at least one second sub-area 201.

Figure 12:
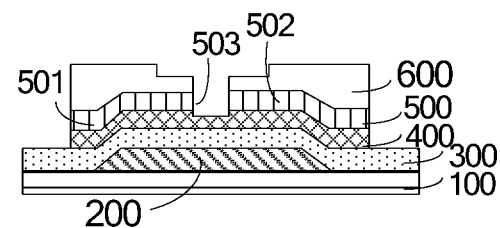
FIG. 12 is a schematic view illustrating the array substrate in step S600 in another embodiment of the present disclosure.

As shown in FIG. 12, the exposed photoresist of the photoresist layer 700 corresponding to the second sub-area 201 corresponds to the second sub-area 201 when conducting the exposure process on the photoresist, and the one channel 503 may be obtained. Conventionally, the width of the channel 503 is configured to be as a width of the whole semiconductor film 2. The width of the channel 503 in the present disclosure is configured to be as the width of the exposed photoresist. As such, the present disclosure may reduce the width of the channel and may improve charging rate when being compared with the conventional manufacturing method. In addition, the drain and the source may be formed on the array substrate corresponding to the first area 10, so as to reduce the size of the TFT and to improve opening rate.

In view of the above, the first area in the mask plate of the present disclosure is configured to be the semi-transparent area and is configured with the at least two first sub-area spaced apart from each other. When manufacturing the array substrate, due to the transmittance rate of the second sub-area is greater than the first sub-area, the thickness of the exposed photoresist on the second sub-area is greater than the thickness of the exposed photoresist on the first sub-area. The photoresist corresponding to the second sub-area may be exposed deeper under the same exposure amount when being compared with the conventional exposure process. As such, the present disclosure may reduce the time and power for the exposure process. In the subsequent ashing process, the present disclosure may terminate the ashing process upon the photoresist corresponding to the second sub-area is completely ashed, and the thickness of the exposed photoresist corresponding to the second sub-area is less than the exposed photoresist corresponding to the first sub-area. After conducting the development process, the thickness of the remaining photoresist corresponding to the second sub-area is less than the thickness of the remaining photoresist corresponding to the first sub-area. As such, the time and the power for conducting the ashing process may be reduced, and the productivity may be improved.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A mask plate, configured to conduct an exposure process on a photoresist layer covering a second metal layer, a semiconductor layer, an insulation layer, and a gate layer on the substrate in sequence, wherein the mask plate comprises:
   a first area configured with at least two first sub-areas, wherein the first sub-areas are spaced apart from each other, and the first sub-areas are configured to be semi-transparent areas;
   a second area configured with at least one second sub-area, wherein the second sub-area is configured between the first sub-areas, and a transmittance rate of the second sub-area is greater than the first sub-area;
   a third area and a fourth area respectively configured next to two sides of the first area;
   a fifth area and a sixth area respectively configured next to one side of the third area and one side of the fourth area, wherein the side of the third area and the side of the fourth area are facing away the first area;
   wherein the second sub-area is configured to be a hollow area or to be a non-hollow area having the transmittance rate greater than the first sub-area;
   when the second sub-area is configured to be the hollow area, a width of the second sub-area is less than a resolution of an exposure machine, the third area and the fourth area are configured to be shading areas, and the fifth area and the sixth area are configured to be full translucent areas;
   when conducting the exposure process on the photoresist layer, a thickness of exposed photoresist via the second sub-area is greater than a thickness of exposed photoresist via the first sub-area, and the photoresist layer with respect to the first sub-area and the second sub-area is partially exposed;
   when manufacturing an array substrate, a channel of the array substrate corresponds to the second sub-area.

2. The mask plate according to claim 1, wherein the exposed photoresist via the second sub-area corresponds to the second sub-area when conducting the exposure process on the photoresist.

3. A mask plate, configured to conduct an exposure process on a photoresist layer covering a second metal layer, a semiconductor layer, an insulation layer, and a gate layer on the substrate in sequence, wherein the mask plate comprises:
   a first area configured with at least two first sub-areas, wherein the first sub-areas are spaced apart from each other, and the first sub-areas are configured to be semi-transparent areas;
   a second area configured with at least one second sub-area, wherein the second sub-area is configured between the first sub-areas, and a transmittance rate of the second sub-area is greater than the first sub-area;
   wherein a thickness of exposed photoresist via the second sub-area is greater than a thickness of exposed photoresist via the first sub-area and the photoresist layer with respect to the first sub-area and the second sub-area is partially exposed when conducting the exposure process on the photoresist layer;
   when manufacturing an array substrate, at least one channel of the array substrate corresponds to the at least one second sub-area.

4. The mask plate according to claim 3, wherein the second sub-area is configured to be a hollow area or to be a non-hollow area having the transmittance rate greater than the first sub-area, when the second sub-area is configured to be the hollow area, a width of the second sub-area is less than a resolution of an exposure machine.

5. The mask plate according to claim 4, wherein the exposed photoresist via the second sub-area corresponds to the second sub-area when conducting the exposure process on the photoresist.

6. The mask plate according to claim 3, wherein the mask plate further comprises:
  a third area and a fourth area are respectively configured next to two sides of the first area;
  a fifth area and a sixth area are respectively configured next to one side of the third area and one side of the fourth area, wherein the side of the third area and the side of the fourth area are facing away the first area;
  wherein the third area and the fourth area are configured to be shading areas, and the fifth area and the sixth area are configured to be full translucent areas.

7. A manufacturing method, comprising:
  providing a substrate;
  forming a gate layer, an insulation layer covering the gate layer and the substrate, a semiconductor layer covering the insulation layer, a second metal layer covering the semiconductor layer, and a photoresist layer covering the second metal layer on the substrate in sequence;
  providing a mask plate and conducting an exposure process on the photoresist layer via the mask plate;
  conducting a development process and transferring patterns on the mask plate onto the photoresist layer;
  wherein the mask layer comprises:
  a first area is configured with at least two first sub-areas, wherein the first sub-areas are spaced apart from each other, and the first sub-areas are configured to be semi-transparent areas;
  a second area is configured with at least one second sub-area, wherein the second sub-area is configured between the first sub-areas, and a transmittance rate of the second sub-area is greater than the first sub-area;
  when conducting the exposure process on the photoresist layer, a thickness of exposed photoresist via the second sub-area is greater than a thickness of exposed photoresist via the first sub-area, and the photoresist layer with respect to the first sub-area and the second sub-area is partially exposed.

8. The manufacturing method according to claim 7, wherein the step of providing the mask plate and conducting the exposure process on the photoresist layer via the mask plate is further comprises:
  the second sub-area is configured to be a hollow area or to be a non-hollow area having the transmittance rate greater than the first sub-area;
  when the second sub-area is configured to be the hollow area, a width of the second sub-area is less than a resolution of an exposure machine.

9. The manufacturing method according to claim 8, wherein the step of providing the mask plate and conducting the exposure process on the photoresist layer via the mask plate is further comprises:
  the exposed photoresist via the second sub-area corresponds to the second sub-area when conducting the exposure process on the photoresist.

10. The manufacturing method according to claim 7, wherein the mask plate further comprises:
  a third area and a fourth area are respectively configured next to two sides of the first area;
  a fifth area and a sixth area are respectively configured next to one side of the third area and one side of the fourth area, wherein the side of the third area and the side of the fourth area are facing away the first area;
  the third area and the fourth area are configured to be shading areas, and the fifth area and the sixth area are configured to be full translucent areas.

11. The manufacturing method according to claim 10, wherein the manufacturing method further comprises:
  conducting a patterned process in the second metal layer and the semiconductor layer via the remaining photoresist of the photoresist layer;
  conducting an ashing process on the remaining photoresist of the photoresist layer;
  terminating the ashing process upon the photoresist layer corresponding to the second sub-area is completely ashed.

12. The manufacturing method according to claim 11, wherein the manufacturing method further comprises:
  conducting the patterned process on the second metal layer and the semiconductor layer via the remaining photoresist layer;
  wherein at least one channel is formed on the array substrate corresponding to the at least one second sub-area.

* * * * *